United States Patent [19]

Gurcan

[11] Patent Number: 5,247,581
[45] Date of Patent: Sep. 21, 1993

[54] CLASS-D BICMOS HEARING AID OUTPUT AMPLIFIER

[75] Inventor: Hakan A. Gurcan, San Jose, Calif.

[73] Assignee: Exar Corporation, San Jose, Calif.

[21] Appl. No.: 765,481

[22] Filed: Sep. 27, 1991

[51] Int. Cl.$^5$ .................................... H04R 25/00
[52] U.S. Cl. ............................... 381/68.4; 381/68.2; 381/68; 330/10
[58] Field of Search .................. 381/68, 68.2, 68.4, 381/68.6, 117; 330/10, 251, 207 A

[56] References Cited

U.S. PATENT DOCUMENTS

| | | | |
|---|---|---|---|
| 4,360,707 | 11/1982 | Joseph et al. | 381/117 |
| 4,517,415 | 5/1985 | Laurence | 381/68.4 |
| 4,689,819 | 8/1987 | Killion | 381/68.6 |

FOREIGN PATENT DOCUMENTS 1294456  5/1969  Fed. Rep. of Germany ...... 328/128

OTHER PUBLICATIONS

"The Miller Integrator", B. H. Briggs, Aug. 1948 (pp. 243-247).

*Primary Examiner*—Jin F. Ng
*Assistant Examiner*—Huyen D. Le
*Attorney, Agent, or Firm*—Townsend and Townsend Khourie and Crew

[57] ABSTRACT

An invention, which is fabricated using a Bipolar and Complementary Metal Oxide Semiconductor (BICMOS) technology which offers both bipolar and CMOS devices on the same silicon substrate is disclosed. The major part of the internal circuitry uses bipolar devices while the output circuit driving the transducer at the output uses CMOS inverters. A voltage regulator which is fed from the battery lines is used to power the majority of the internal circuitry leaving only the CMOS output driver and part of a level converter to be powered directly from the battery lines. This architecture guarantees that no signal is fed back to the previous stages of the hearing aid system through the battery lines, ensuring stable operation for an extended range of the battery internal impedance value. The bipolar front-end blocks of the circuit are designed using low-voltage bipolar design techniques to operate at the 1 volt level produced by the internal voltage regulator. The voltage regulator employs a bipolar base-emitter voltage reference, which ensures the tracking of its output voltage with the headroom requirements of the bipolar circuitry over the temperature and process variations.

17 Claims, 4 Drawing Sheets

CLASS-D BICMOS HEARING AID OUTPUT AMPLIFIER

BACKGROUND

The present invention relates to class-D output amplifiers for hearing aids.

With the advances in manufacturing technologies and circuit design techniques, hearing aid devices have been considerably reduced in size and their functionality has been increased. In recent years, hearing aid output amplifiers employing class-D architecture have been successfully designed and fabricated. See U.S. Pat. No. 4,689,819 and F. Callias et al., "A Set of Four IC's in CMOS Technology for a Programmable Hearing Aid", IEEE JSSC, p.301, April 1989.

Class-D amplifiers combine low power consumption with low harmonic distortion levels without having to go to power/distortion tradeoffs of the conventional class-A and class-B amplifiers. Class-A amplifiers offer low distortion with the expense of a high idle current, while class-B amplifiers offer significantly lower idle current operation but suffer from crossover distortion at low signal levels. However, class-D amplifiers are considerably more complicated than their class-A and class-B counterparts.

A class-D amplifier uses an oscillator which generates a high frequency triangular waveform. It is also possible to employ an oscillator with a high frequency square wave output. In the latter case, the triangular waveform required in the modulation process is obtained by integrating the square wave. The input to be amplified is added to the triangular wave and this composite signal is compared to a reference voltage level. This process, commonly known as pulse-width-modulation or as pulse-duration-modulation, gives at the output of the comparator a square wave pulse train with a duty cycle continuously changing in response to the input signal. This signal is then provided to a transducer where it is converted back into an amplitude level which is an amplified replica of the input signal.

An important problem of any hearing aid design is stability. The nonzero value of the battery internal impedance causes the voltage at the battery line to be modulated by the signal current flowing through the transducer. This effect can feed back to the front-end circuit blocks where lower signal levels are processed and can cause instabilities. Systems using class-D output amplifiers are no exception in this matter. The class-D output amplifiers of prior art have used compensation schemes to cancel out the adverse effects of the battery internal impedance on the system stability. These compensation schemes are somewhat successful at high frequencies but the proposed methods are not satisfactory at low frequencies. Besides the stability of the amplifier itself, these output amplifiers required external resistor-capacitor (RC) lowpass filters to filter out the unwanted signals from the supply voltage to the external circuit blocks such as preamplifiers, filters and to the microphone. Such RC filters often require a large value capacitor which increases the overall size of the hearing aid device.

The batteries found in today's hearing aid devices are typically single cell, 1.2-1.6 volt batteries. Although great advances have been made in the battery technology, the limited voltage and current capacity of a single cell still poses a major challenge in the hearing aid design field. A successful hearing aid circuit must be able to operate at low voltages and consume a minimal amount of power. Recently, attempts have been made to take advantage of the low current consumption of the CMOS devices operating in switching mode. This limits what can be done with CMOS circuitry in an analog hearing aid system. However, bipolar circuitry which is intrinsically better suited for low voltage analog applications can be employed to design higher performance hearing aid devices while still keeping the power consumption at an acceptable level.

SUMMARY OF THE INVENTION

The present invention is fabricated using a Bipolar and Complementary Metal Oxide Semiconductor (BICMOS) technology which offers both bipolar and CMOS devices on the same silicon substrate. The major part of the internal circuitry uses bipolar devices while the output circuit driving the transducer uses CMOS inverters. A voltage regulator which is fed from the battery lines is used to power the majority of the internal circuitry leaving only the CMOS output driver and part of a level converter to be powered directly from the battery lines. This architecture guarantees that no signal is fed back to the previous stages of the hearing aid system through the battery lines, ensuring stable operation for an extended range of the battery internal impedance value. The bipolar frontend blocks of the circuit are designed using low-voltage bipolar design techniques to opeate at the 1 volt level produced by the internal voltage regulator. The voltage regulator employs a bipolar base-emitter voltage reference, which ensures the tracking of its output voltage with the headroom requirements of the bipolar circuitry over the temperature and process variations.

The internal voltage regulator can also be used to power external components such as microphones and adequately designed preamplifiers, eliminating the necessity of using an external resistor-capacitor (RC) lowpass network which would otherwise be needed to filter out the unwanted signals from the battery line.

The class-D modulation is performed by the internal circuitry consisting of an oscillator, a summing integrator, a reference generator and a comparator. The output signal of the comparator is fed into a level converter and from there to output inverters which drive the transducer.

The oscillator is of the emitter coupled type and runs at an ultrasonic frequency. It generates a square wave of a defined amplitude which is integrated by a simple resistor-capacitor integrator to obtain a triangular waveform at the input of the comparator. The integrator also performs the weighted summing function of the audio signal and the ultrasonic square wave. The resulting waveform at the input of the comparator is the ultrasonic triangle wave riding on the audio signal. The comparator input is a unique, symmetrical, differential input which receives the signal from the integrator on one line and a reference voltage on the other line. This differential input allows the setting of the comparison point at the desired level by properly controlling the reference voltage. The integrator signal is compared to the reference voltage which, according to another feature of the invention, is precisely equal to the average value of the ultrasonic signal with zero audio input. Thus, with no audio signal input, the triangular waveform's excursions above and below the reference level are of the same duration, resulting in a 50% duty cycle square wave signal at the output of the comparator. As known to those knowledgeable in the art, in a class-D modulator system the duty cycle of the pulses at the output of the comparator depends on the amplitude of the input modulating signal, the audio signal in this case. The audio information of the input is conveyed by the duty cycle at the output of the modulator, provided that the frequency of the modulated signal, the ultrasonic waveform in this case, is at least twice the highest frequency component of the modulating signal. If this condition is met, the original audio signal can be reconstructed from the duty cycle information by a simple filtering operation.

The pulse-width-modulated (PWM) signal from the comparator is fed into a level converter which converts the low level swings to rail-to-rail swings required to drive the CMOS output driver. The output driver consists of two identical tapered chains of three inverters, with the last inverters in the chain large enough to drive the electroacoustical transducer.

The necessary filtering operation is done by the human ear, which extracts the frequency components within its hearing range and neglects the ultrasonic ones. The conventional transducers used in the hearing aid devices show inductive behavior at high frequencies. CMOS devices used at the output take advantage of this property of the transducers by allowing the high frequency carrier energy to be returned to the battery. A considerable portion of the carrier energy stored in the magnetic field of the inductor during one-half period is transferred back to the battery in the following half period, through the CMOS output transistors. In this process, a tolerable amount of high frequency energy is lost due to the leakage capacitance between transducer windings, to the battery internal resistance and to the nonzero ON resistances of the CMOS output transistor. By the same principle, the current consumption of the circuit can be further lowered by inserting a miniature inductor in series with the transducer.

The present invention also provides a resistance in the oscillator block which can be adjusted to optimize the idling current level with different types of transducers. For a further understanding of the nature and advantages of the invention, reference should be made to the ensuing detailed description taken in conjunction with the accompanying drawings.

DETAILED DESCRIPTION OF THE PREFERRED EMBODIMENT

The present invention concerns a hearing aid output amplifier integrated circuit fabricated in a Bipolar and Complementary Metal Oxide Semiconductor (BIC-MOS) process technology which offers bipolar and CMOS devices on the same silicon substrate.

Figure 1:
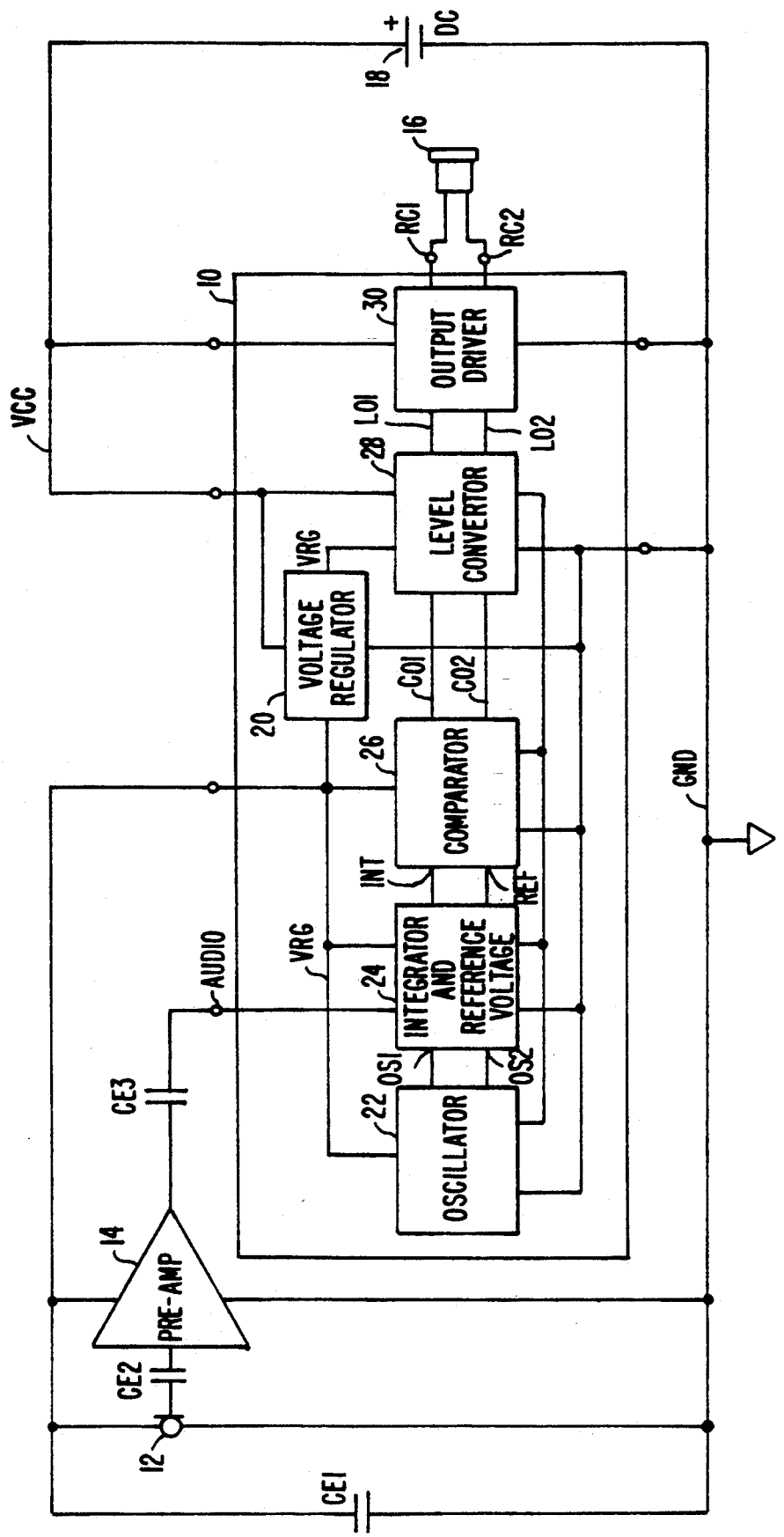
FIG. 1 is a functional block diagram of a preferred embodiment of the present invention.

FIG. 1 is a block diagram of the present invention. The BICMOS output amplifier is shown enclosed within retangle 10 representing the integrated circuit chip, along with its associated external components required to build a complete hearing aid system. The audio signal is picked up by a microphone 12 and is preamplified by a preamplifier 14. The preamplified audio frequency signal enters the output amplifier 10 at terminal "audio" and, being amplified by output amplifier 10, drives a conventional hearing aid transducer 16 connected between the output terminals RC1 and RC2.

The system is powered by a 1.15 to 1.60 volt battery 18 connected between the power buses VCC and GND. An internal voltage regulator 20, schematically illustrated in FIG. 7 and discussed in detail further on, draws its power from buses VCC and GND and generates a regulated voltage of approximately 1 volt on the internal power bus VRG which is used as the supply voltage by the major part of the internal circuitry.

Figure 2:
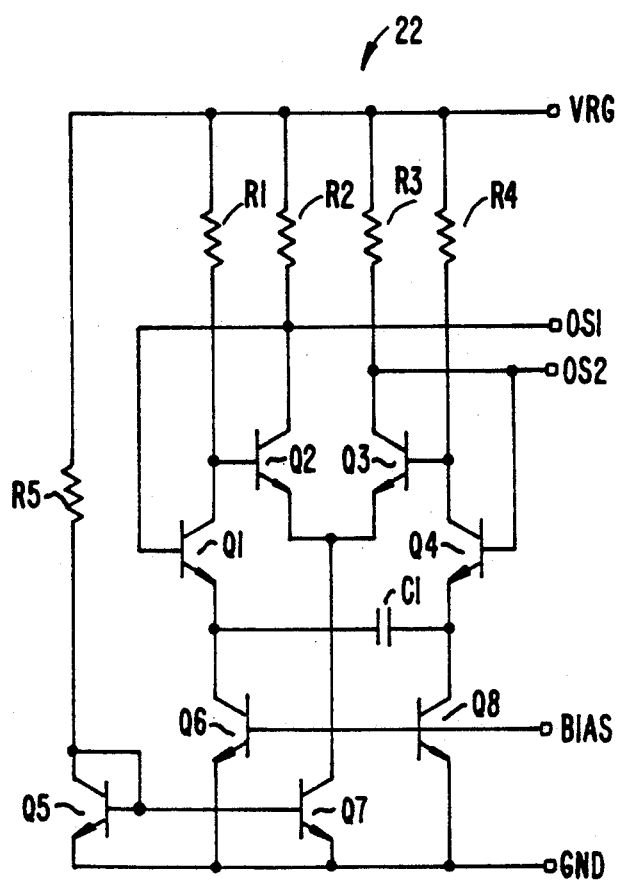
FIG. 2 is a schematic drawing of the oscillator circuit of FIG. 1.

An oscillator 22, schematically illustrated in FIG. 2 and discussed in detail further on, draws its power from buses VRG and GND and generates between its output nodes OS1 and OS2 an ultrasonic square wave of 50% duty cycle. A summing integrator and reference generator 24, schematically illustrated in FIG. 3 and to be discussed further on, also drawing its power from buses VRG and GND, integrates the waveform at its input nodes OS1 and OS2 and produces a triangular waveform at its integration output node INT. At the same time, it generates a reference voltage at its reference output REF of a value precisely equal to the average value of the waveform at node INT which will be used as a threshold voltage by a comparator 26 as discussed in detail further on.

The audio signal enters the system at terminal "audio", capacitively coupled to the output of the preamplifier 14 and is summed up with the triangular waveform at node INT using a predefined weighting ratio as will be focused on later in the description. Thus, a waveform composed of the audio signal and of the ultrasonic triangular waveform produced by the integration process is present at node INT. In the absence of an audio frequency signal at terminal "audio", the excursions of the signal at node INT above and below the reference voltage at node REF are of equal duration. Any audio signal input shifts the ultrasonic triangular waveform around the reference voltage, changing the duration of the time intervals between "axis crossings". The term "axis crossing" will be used throughout the description of the invention to denote the moment of excursion of the composite signal at node INT through the reference voltage value at node REF.

Comparator 26, schematically illustrated in FIG. 4 and discussed later in the description, also drawing its power from busses VRG and GND, compares the composite waveform at its input node INT with the threshold voltage at its other input REF and switches its complementary outputs CO1 and CO2 at the axis crossings of the input. The output waveforms at nodes CO1 and CO2 are ultrasonic square waves in opposite phases with duty cycles changing in a complementary fashion in response to the shifts in the axis crossings caused by the audio signal at input terminal "audio". A larger amplitude audio signal causes more change in the duty cycle of the complementary square waves since it causes a larger shift in the axis crossings. Thus, a pulse width modulation process is achieved by adjusting the widths of the ultrasonic pulses derived from the oscillator, in response to the audio signal amplitude.

A level converter 28, schematically illustrated in FIG. 5 and described later in the description, transforms the voltage levels at its differential input nodes CO1 and CO2 to rail-to-rail swings at its differential output nodes LO1 and LO2. Thus, pulse width modulated ultrasonic square waves with excursions ranging from VCC to GND are present at nodes LO1 and LO2 in opposite phases as required by the CMOS output driver.

Figure 6:
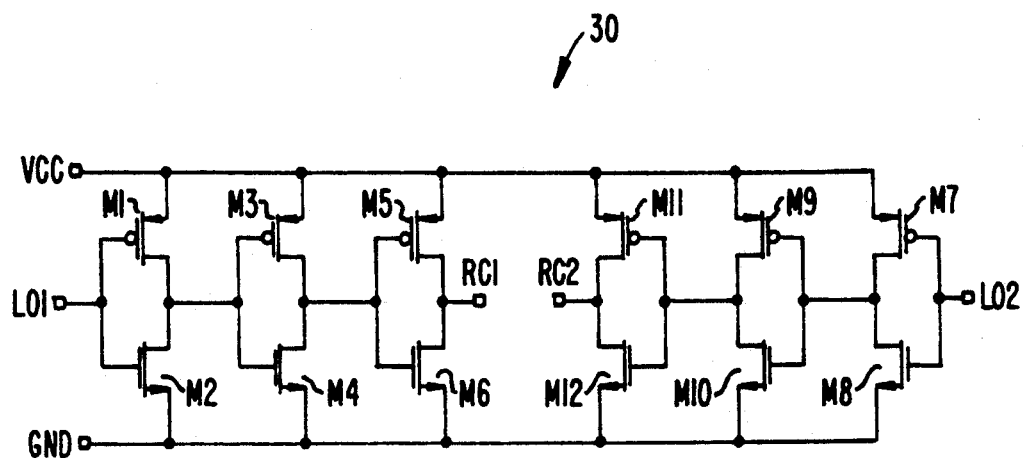
FIG. 6 is a schematic drawing of the output driver circuit of FIG. 1.

An output driver 30, schematically illustrated in FIG. 6 and discussed further on, drawing its power from buses VCC and GND, is used to obtain the drive capability required to feed a conventional hearing aid transducer connected between the opposite phase output nodes RC1 and RC2 with the pulse width modulated square waves present at nodes LO1 and LO2.

Following is a detailed description of the circuit blocks forming the output amplifier. The schematic diagram of oscillator 26 of FIG. 1 is given in FIG. 2. The oscillator is of the emitter coupled type. Bipolar transistors Q2 and Q3 along with their collector load resistors R2 and R3 form a differential amplifier biased by current source transistor Q7. The positive feedback arrangement built around the differential amplifier with Q1, Q4, R1 and R4 ensures that the circuit oscillates at a frequency defined by the voltage swings across R2 and R3, the value of the on-chip capacitor C1 and the discharge currents provided by the current source transistors Q6 and Q8. The bias voltage required at the bases of Q6 and Q8 is supplied to this block via bias node BIAS, as will be discussed later in connection with FIG. 4. Totally symmetrical operation is achieved by making each element in one half-circuit as an identical twin of its counterpart in the other half-circuit. Thus, a symmetrical ultrasonic waveform is obtained between the oscillator output nodes OS1 and OS2. Q5, connected as a diode, along with bias resistor R5, produces a bias voltage at the base of Q7 which defines its collector current. Since the voltage drop across R2 (or R3) is one of the factors governing the oscillation frequency, it is possible to change the frequency by adjusting R5. Thus, it is possible to run the circuit at a frequency best suited for a particular type of transducer used at the output, making it possible to minimize high frequency losses of the output switching. Experimenting with various types of transducers has shown that the best results in terms of idle current are obtained with oscillator frequencies ranging from 50 kHz to 200 kHz, depending on the particular type of transducer connected to the output terminals. The value of R5 can be adjusted by one of various methods such as metal mask option, zener zapping to short out the unwanted portion of R5 or employing multiple pads connected to tapping points on R5.

Figure 3:
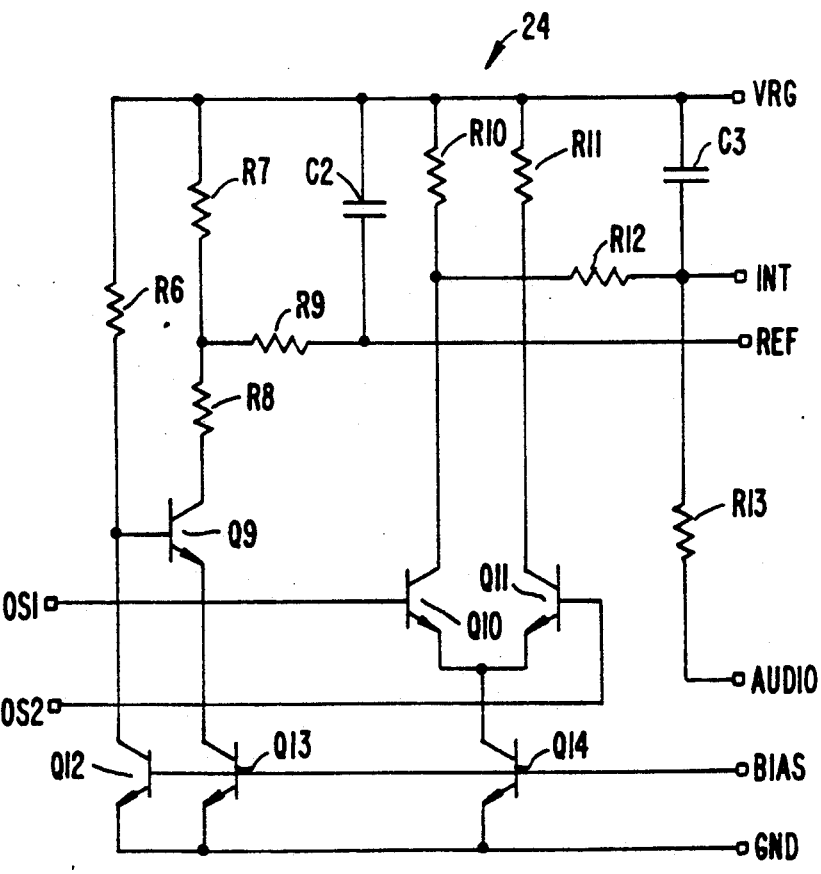
FIG. 3 is a schematic drawing of the summing integrator and reference generator circuit of FIG. 1.

The detailed schematic diagram of the summing integrator and reference generator 24 of FIG. 1 is shown in FIG. 3. The signal from the oscillator enters this block at the input terminals OS1 and OS2. Transistors Q10 and Q11 along with resistors R10 and R11 form a differential amplifier biased by current source transistor Q14. The output signal of the oscillator, which is not a perfect square wave mainly due to the limited loop gain in that circuit block, gets amplified by the differential amplifier of Q10/Q11 and approximates a square wave. R12, R13 and C3 form the summing integrator. This simple circuitry performs the integration of the ultrasonic square wave and the weighted addition of the audio signal to the triangular waveform produced in the integration process. The weighting ratio of the waveforms entering the summing integrator is defined by the relative values of the integration resistors R12 and R13, provided that R10 and the audio source impedance are negligible with respect to R12 and R13. The value of the integration capacitor C3 is chosen so that a triangular wave of reasonable linearity is produced at an output INT by the simple integration of the ultrasonic square wave. Transistor Q9, resistors R6, R7, R8, R9, capacitor C2 and current source transistors Q12, Q13 form a reference generator circuit, producing a voltage level at output REF, precisely equal to the average value of the waveform at integration output INT, independent of the process variations. The values of R9 and of C2 are selected so that the impedance looking into output REF is essentially the same as the one looking into output INT. This architecture of the block assures that the same instantaneous voltages and the same impedances are presented by the two outputs to the subsequent block at axis crossings. C2's inclusion also guarantees that any high frequency noise signal which may be present on the VRG bus will appear at the REF output as well as at the INT output (the appearance of the noise signal at INT is mainly due to the integration capacitor C3 connected between VRG and INT). Thus, as long as the following circuit block has differential inputs with a reasonable common mode rejection, the noise signals on INT and REF will not create a problem since the differential noise voltage between the two named outputs will be nearly zero. The bias voltage to the bases of the current source transistors of this stage are supplied via node BIAS.

Figure 4:
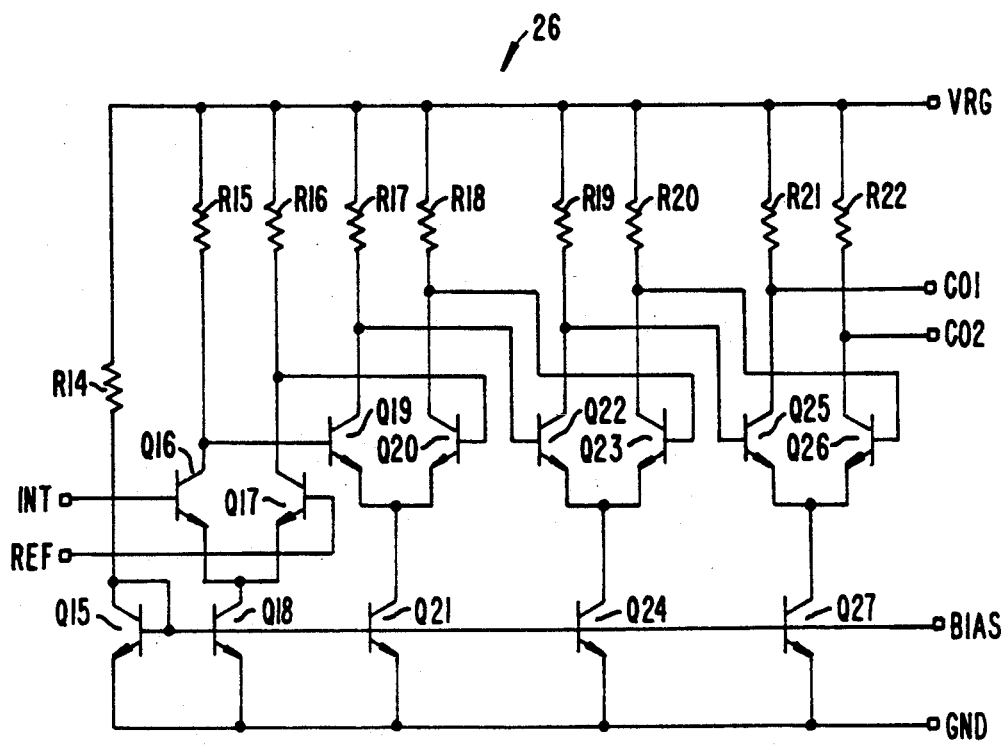
FIG. 4 is a schematic drawing of the comparator circuit of FIG. 1.

FIG. 4 is a schematic diagram of the comparator block 26 of FIG. 1. The comparator consists of four cascaded differential stages. The architecture is designed so that a reasonable gain and input offset is obtained while operating at low current levels and low voltages. Q16 and Q17, along with their respective load resistors R15 and R16 form the differential input stage biased by current source transistor Q18. The second stage is formed by Q19, Q20, R17, R18 and Q21. Similarly, the third and the fourth stages are comprising of Q22, Q23, R19, R20, Q24 and Q25, Q26, R21, R22, Q27, respectively. The bias voltage of the current source transistors is set by diode connected Q15 and by resistor R14. This bias voltage is also made available to other circuit blocks via the BIAS node. The differential inputs INT and REF are connected to the INT and REF outputs of the integrator and reference generator block. The comparator outputs CO1 and CO2 change states whenever an axis crossing occurs at the input. With no audio signal component present at the INT output of the integrator, the axis crossings occur with equal time intervals at the rising and falling edges of the ultrasonic triangular wave at node INT of FIG. 1. This condition is referred to as "idling" and causes the comparator to produce at its outputs CO1 and CO2 a square wave of 50% duty cycle. Since the same instantaneous voltages and the same impedances are presented to INT and REF inputs at the axis crossings, the idling duty cycle is guaranteed to be 50% with no dependence on process variations and with no need of trimming of any component. Any deviation from the 50% idling duty cycle is caused by the component mismatches which are kept at a minimum by careful planning of the component placement and geometries during the layout design phase of the integrated circuit. The prototype circuits consistently give idling duty cycles with less than 2% deviation from the ideal value of 50%.

Going back to FIG. 1, an audio signal entering the integrated circuit at terminal "audio" causes the triangular waveform at node INT to shift around the reference voltage at node REF as the result of the summing operation performed by the summing integrator 24. Thus the time intervals between the axis crossings change in response to the audio signal amplitude. The comparator 26, switching at the axis crossings, produces at its output nodes CO1 and CO2 opposite phase square wave signals with duty cycles following the audio signal amplitude. Thus, a pulse width modulation is achieved where the audio signal amplitude changes are converted to changes in the duty cycles of the square waves at nodes CO1 and CO2.

As well known in the art, such a pulse width modulated signal is composed of low frequency components of the modulating signal and high frequency components of the modulated signal. The original audio information can be restored from the pulse width modulated signal by a simple low pass filtering process (which will be done by the human ear, since it cannot hear anything above 18-20 kHz. As a matter of fact, the transducer won't be able to reproduce the ultrasonic frequency either.).

Figure 5:
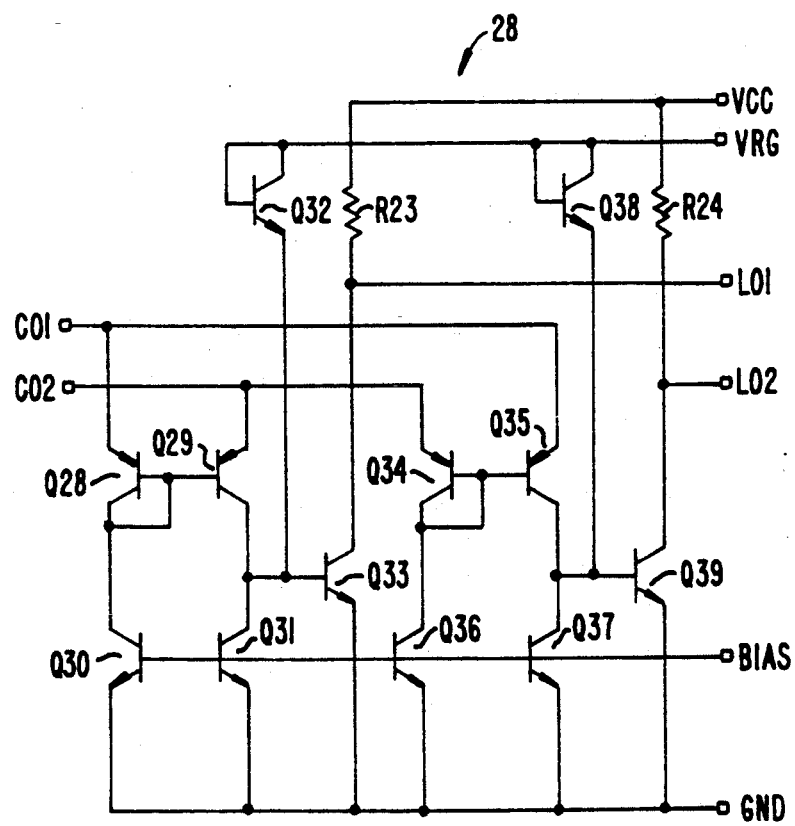
FIG. 5 is a schematic drawing of the level converter circuit of FIG. 1.

The level converter 28 of FIG. 1 is schematically illustrated in FIG. 5. It consists of two identical halves and converts the differential square wave at the comparator outputs to full swing square waves at its outputs LO1 and LO2. To explain the operation of FIG. 5, first consider one half-circuit consisting of Q28, Q29, Q32, Q33, R23 and the current source transistors Q30 and Q31 and suppose the voltage level at input CO1 is higher than the one at input CO2. In this case, diode connected Q28 is carrying the collector current of current source Q30. However, Q29 can carry a lesser current since its base-emitter voltage is less than the one of Q28. Thus the extra current demand of the current source transistor Q31 pulls the base of switch transistor Q33 to a low voltage value, causing the latter to turn off. Since no current is flowing through R23, the output voltage at LO1 is equal to the voltage of the VCC bus. Q32 assures that Q31 never goes into saturation which would otherwise disturb the operation of the current source transistors biased from the same BIAS node. When the voltage level of CO1 goes below CO2, the base-emitter voltage of Q29 is larger than the one of Q28 and as a consequence Q29 demands a larger collector current than current source Q31 can supply. This condition causes the voltage at the base of Q33 to rise and Q33 to go into saturation, pulling the LO1 output towards the GND bus. The output low level is defined by the saturation voltage of Q33 which is less than 100 millivolts. The same principle of operation applies to the other half-circuit of Q34, Q35, Q38, Q39, R24 and current source transistors Q36 and Q37 with the reversal of the inputs and the substitution of component and output node names. In order to be able to drive the CMOS output driver adequately, the output load resistors R23 and R24 are connected to the VCC bus.

FIG. 6 shows the schematic diagram of the output driver block 30 in FIG. 1, which consists of two tapered chains of three inverters. The first chain is formed with PMOS transistors M1, M3, M5 and NMOS transistors M2, M4, M6. Similarly the second chain is formed with M7, M9, M11 and M8, M10, M12. The basic task of the circuit is to amplify the full-swing pulse width modulated square waves at its inputs LO1 and LO2 to a current level sufficient to drive conventional transducers connected between its outputs RC1 and RC2. Using a tapered configuration in the chains assures that no significant capacitive load is presented to the driving stage at the inputs while achieving the low ON resistance at the outputs required to drive the transducer with a maximum voltage swing. The opposite phase outputs swing within a few tens of millivolts of VCC and GND buses and as a consequence, a transducer connected between RC1 and RC2 sees a differential swing of approximately twice the supply voltage. The hearing aid transducers show an inductive behavior at high frequencies which helps to lower the high frequency losses by returning a considerable portion of high frequency energy back to the battery through the low ON resistance of the output MOS transistors. However, the audio frequency components of the pulse width modulated signal at the outputs RC1 and RC2 are converted back to the audible signals by the transducer.

Figure 7:
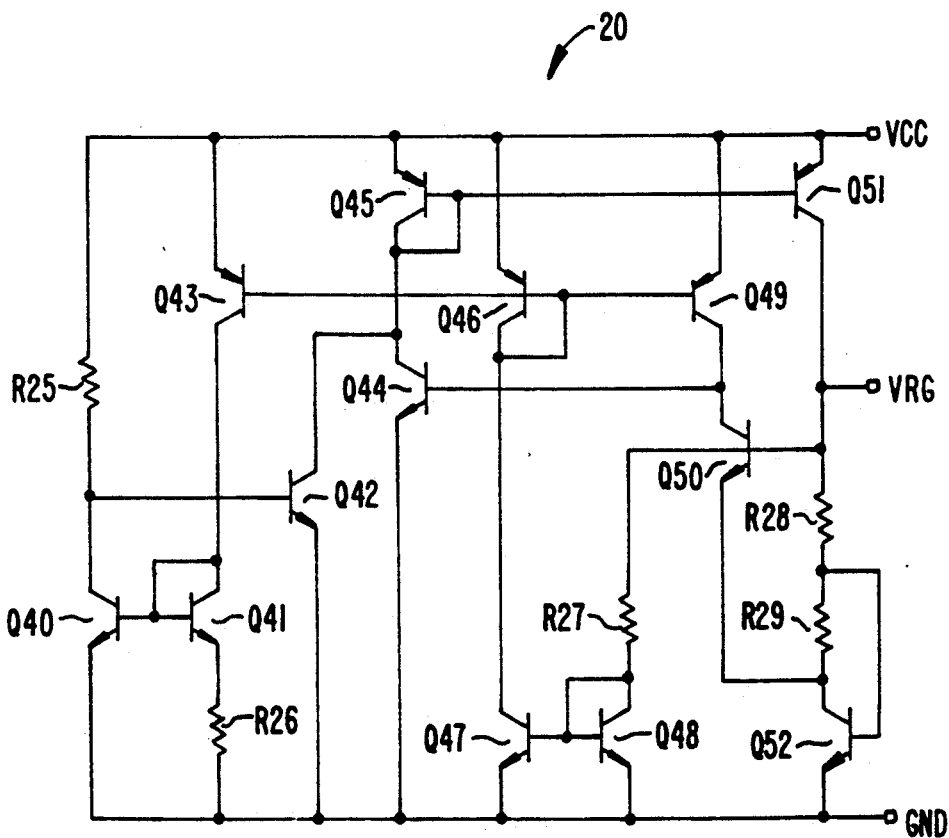
FIG. 7 is a schematic drawing of the voltage regulator circuit of FIG. 1.

The voltage regulator 20 of FIG. 1, supplying the regulated power to most of the internal circuitry is schematically illustrated in FIG. 7. The output voltage at node VRG is set by the base-emitter voltage of Q52 and by a fraction of the base-emitter voltage of Q50. The feedback loop keeping the output voltage regulated consists of Q50, Q44, Q45 and Q51. Q47, Q48 and R27 are used to set a current bias for diode connected Q46, which in turn produces the bias voltage for the current source transistors Q43 and Q49. Current source transistor Q49 operates as an active load at the collector of Q50. Q43, along with Q40, Q41, Q42, R25 and R26 forms the start-up circuit which ensures that the circuit properly starts to operate when the battery voltage is first applied between VCC and GND buses. The regulator is stabilized with an external bypass capacitor connected between VRG and GND buses (CE1 of FIG. 1). By using a voltage derived from the bipolar transistor's base-emitter voltage in the generation of the regulator output voltage, tracking of VRG with the headroom requirements of the internal circuitry is maintained for a wide range of process and operating temperature changes.

Supplying most of the internal circuitry from a regulated voltage ensures stable operation of the integrated circuit for a wide range of battery internal impedance values. Stability problems arise from the voltage drop across the battery internal impedance and worsen with high output levels. The problem is even more pronounced at low frequencies for the transducer at the output being driven by a voltage source, which is the case with the present invention. The impedances of transducers tend to decrease significantly as the driving signal frequency is lowered. If the driving signal amplitude remains constant, this impedance loss means more current flowing through the transducer, which in turn would cause a higher value of voltage drop across the battery internal impedance. This signal can feed back to the front end circuits and can cause signal distortion and system instability. The problem may be solved by filtering out the unwanted components from the power supply lines to the front-end blocks (the front end blocks are oscillator 22, integrator 24, comparator 26 and half of level converter 28). The most common way of filtering is to form a simple lowpass filter with one resistor and a capacitor in series with the supply line. However, as the signal frequency is lowered more filtering is needed which, in turn, means higher RC time constants for the filter. The resistor cannot be increased at will, its value being limited by the maximum allowable voltage drop across it. Thus, more filtering at low frequencies requires a higher value capacitor, which is at the same time physically bulkier. However, the solution to the stability problem offered with the present invention uses a voltage regulator which can be stabilized by a relatively low valued capacitor and which intrinsically holds regulation in the low frequency domain, totally isolating the noisy power supply lines from the front-end circuitry. At the high frequency range, where the regulator's response is slow when compared to the fast transients on the supply lines, the necessary filtering is performed by the stabilization capacitor CE1 between the voltage regulator output VRG and GND buses.

In addition to this, an extra precaution is taken in the internal circuitry by extensive use of balanced architectures keeping the common mode rejection high to reject the disturbances coming through the supply lines. These factors, altogether, ensure stable operation of a hearing aid system employing the present invention, for a wide range of battery impedance, signal amplitude and signal frequency conditions.

The overall circuit is characterized by a low signal distortion level of 0.5%, typically. The distortion at high output levels is typically 5%. The voltage gain of the integrated circuit from the audio input to the output is typically 24 dB. The current consumption is typically 250 µA. The operating voltage range is from 1.15 to 1.60 volts. The regulator output voltage for external components is typically 1 volt.

As will be understood by those familiar with the art, the present invention may be embodied in other specific forms without departing from the spirit or essential characteristics thereof. For example, more or less than four stages could be used in comparator 26. Accordingly, the disclosure of the preferred embodiment of the invention is intended to be illustrative, but not limiting, of the scope of the invention which is set forth in the following claims.

What is claimed is:

1. A BICMOS integrated circuit hearing aid amplifier comprising:
   a front end circuit built with bipolar transistors to operate with a 1 volt supply voltage, including an oscillator and having a microphone input;
   an MOS output driver coupled to an output of said front end circuit;
   a battery input coupled to said MOS output driver; and
   a voltage regulator having an input coupled to said battery input and an output coupled to said front end circuit to provide a front end voltage supply isolated from said battery input.

2. The hearing aid amplifier of claim 1 wherein said voltage regulator is constructed with bipolar transistors, said output of said voltage regulator being a function of the base-emitter voltage of one of said bipolar transistors.

3. The hearing aid amplifier of claim 1 further comprising:
   a microphone having a power supply input coupled to said voltage regulator output; and
   a preamplifier coupled between said microphone and said microphone input to said bipolar front end having a power supply input coupled to said voltage regulator output.

4. The hearing aid amplifier of claim 1 wherein said front end circuit further comprises:
   an integrator coupled to an output of said oscillator, said microphone input being coupled to said integrator;
   a comparator having a differential input with first and second input terminals, said first input terminal being coupled to an output of said integrator; and
   a voltage reference generator having an output coupled to said second input terminal of said comparator.

5. The hearing aid amplifier of claim 4 wherein said comparator includes a plurality of cascaded differential bipolar transistor pairs, each transistor pair being coupled between a current source and load resistors, said load resistors being coupled to said voltage regulator output.

6. The hearing aid amplifier of claim 4 wherein said voltage reference generator includes components matching components of said integrator such that a voltage output of said voltage reference generator will vary with temperature in the same manner as said integrator output.

7. The hearing aid amplifier of claim 6 wherein said integrator includes a differential bipolar transistor pair coupled to said oscillator output and a current source, a first resistor coupled between said transistor pair and said integrator output, a second resistor coupled between said integrator output and said microphone input, and a capacitor coupled between said integrator output and said front end voltage supply, and
   said voltage reference generator includes a bipolar transistor coupled to a current source, a third resistor coupled to said bipolar transistor, a fourth resistor coupled between said third resistor and said voltage reference generator output and a second capacitor coupled between said voltage reference generator output and said front end voltage supply.

8. The hearing aid circuit of claim 1 wherein said oscillator includes a current source transistor with its base current controlled by a resistor, said resistor having a value chosen for a particular transducer to be coupled to said output driver to control the frequency of oscillation of said oscillator to give an optimum idle current.

9. The amplifier of claim 1 wherein said front end circuit has no path from said voltage supply to ground through more than one base-emitter junction.

10. An integrated circuit hearing aid amplifier comprising:
   a front end circuit including
   an oscillator,
   an integrator built with bipolar transistors coupled to an output of said oscillator and having a microphone input,
   a comparator built with bipolar transistors and having a differential input with first and second input terminals, said first input terminal being coupled to an output of said integrator,
   a voltage reference generator built with bipolar transistors and having an output coupled to said second input terminal of said comparator, wherein said voltage reference generator includes components matching components of said integrator such that a voltage output of said voltage reference generator will vary with temperature in the same manner as said integrator output;

an MOS output driver coupled to an output of said front end circuit;

a battery input coupled to said MOS output driver; and a voltage regulator having an input coupled to said battery input and an output coupled to said front end circuit to provide a front end voltage supply isolated from said battery input.

11. A hearing aid amplifier comprising:

an oscillator, an integrator coupled to an output of said oscillator and having a microphone input, a comparator having a differential input with first and second input terminals, said first input terminal being coupled to an output of said integrator, a voltage reference generator having an output coupled to said second input terminal of said comparator, wherein said voltage reference generator includes components matching components of said integrator such that a voltage output of said voltage reference generator will vary with temperature in the same manner as said integrator output; and an output driver coupled to an output of said comparator.

12. A hearing aid amplifier comprising:

an oscillator, an integrator coupled to an output of said oscillator and having a microphone input, a comparator having a differential input with first and second input terminals, said first input terminal being coupled to an output of said integrator, a voltage reference generator having an output coupled to said second input terminal of said comparator, wherein said voltage reference generator includes components matching components of said integrator such that a voltage output of said voltage reference generator will vary with temperature in the same manner as said integrator output; and an output driver coupled to an output of said comparator;

wherein said output driver is constructed with MOS transistors and said oscillator, integrator, comparator and voltage reference generator are constructed with bipolar transistors, and further comprising a level converter coupled between said comparator and said output driver for converting bipolar levels to MOS levels.

13. A hearing aid amplifier comprising:

an oscillator;

a microphone input;

an integrator coupled to an output of said oscillator, said microphone input being coupled to said integrator;

a comparator having a differential input with first and second input terminals, a plurality of cascaded differential bipolar transistor pairs coupled to said input terminals, each transistor pair being coupled between a current source and load resistors, said load resistors being coupled to a voltage supply, said first input terminal being coupled to an output of said integrator;

a voltage reference generator having an output coupled to said second input terminal of said comparator;

an MOS output driver coupled to an output of said comparator;

a battery input coupled to said MOS output driver; and a voltage regulator having an input coupled to said battery input and an output coupled to said voltage supply for said oscillator, integrator and comparator to provide a voltage supply isolated from said battery input.

14. A hearing aid amplifier comprising:

an oscillator;

a microphone input;

an integrator coupled to an output of said oscillator, said microphone input being coupled to said integrator, said integrator including a differential bipolar transistor pair coupled to said oscillator output and a current source, a first resistor coupled between said transistor pair and said integrator output, a second resistor coupled between said integrator output and said microphone input, and a first capacitor coupled between said integrator output and a front end voltage supply;

a comparator having a differential input with first and second input terminals, said first input terminal being coupled to an output of said integrator;

a voltage reference generator having an output coupled to said second input terminal of said comparator, said voltage reference generator including components matching components of said integrator such that a voltage output of said voltage reference generator will vary with temperature in the same manner as said integrator output, said voltage reference generator including a bipolar transistor coupled to a current source, a third resistor coupled to said bipolar transistor, a fourth resistor coupled between said third resistor and said voltage reference generator output and a second capacitor coupled between said voltage reference generator output and said front end voltage supply;

an MOS output driver coupled to an output of said comparator;

a battery input coupled to said MOS output driver; and a voltage regulator having an input coupled to said battery input and said front end voltage supply as an output coupled to said oscillator, integrator and comparator to provide a voltage supply isolated from said battery input.

15. A BICMOS integrated circuit hearing aid amplifier comprising:

a front end circuit built with bipolar transistors including an oscillator and having a microphone input;

an MOS output driver coupled to an output of said front end circuit;

a battery input coupled to said MOS output driver;

a voltage regulator having an input coupled to said battery input and an output coupled to said front end circuit to provide a front end voltage supply isolated from said battery input; and level converter means, coupled between said front end circuit and said MOS output driver, for converting bipolar levels to MOS levels.

16. The hearing aid amplifier of claim 14 wherein said voltage regulator is constructed with bipolar transistors, said output of said voltage regulator being a function of the base-emitter voltage of one of said bipolar transistors.

17. The hearing aid amplifier of claim 14 further comprising:

a microphone having a power supply input coupled to said voltage regulator output; and a preamplifier coupled between said microphone and said microphone input to said bipolar front end having a power supply input coupled to said voltage regulator output.

* * * * *